(12) United States Patent
Moriwaki

(10) Patent No.: US 12,396,165 B2
(45) Date of Patent: Aug. 19, 2025

(54) MICROELECTRONIC DEVICES, AND RELATED MEMORY DEVICES, ELECTRONIC SYSTEMS, AND METHODS

(71) Applicant: Micron Technology, Inc., Boise, ID (US)

(72) Inventor: Yoshikazu Moriwaki, Hiroshima (JP)

(73) Assignee: Micron Technology, Inc., Boise, ID (US)

( * ) Notice: Subject to any disclaimer, the term of this patent is extended or adjusted under 35 U.S.C. 154(b) by 432 days.

(21) Appl. No.: 17/931,430

(22) Filed: Sep. 12, 2022

(65) Prior Publication Data

US 2024/0090206 A1   Mar. 14, 2024

(51) Int. Cl.
  *H10B 12/00*   (2023.01)

(52) U.S. Cl.
  CPC .................................. *H10B 12/50* (2023.02)

(58) Field of Classification Search
  CPC ............................... H10D 84/85; H10B 12/50
  See application file for complete search history.

(56) References Cited

U.S. PATENT DOCUMENTS

| | | | |
|---|---|---|---|
| 2010/0032732 A1* | 2/2010 | Booth, Jr. | H10B 20/25 257/E21.409 |
| 2011/0031582 A1* | 2/2011 | Booth, Jr. | H01L 23/5252 257/734 |
| 2019/0013323 A1* | 1/2019 | Bhattacharyya | H10D 30/694 |
| 2019/0280108 A1* | 9/2019 | Toh | H10D 86/215 |
| 2020/0295161 A1* | 9/2020 | Toh | H10D 30/024 |
| 2022/0199774 A1* | 6/2022 | Wei | H10D 30/6211 |
| 2022/0199779 A1* | 6/2022 | Kawana | H10D 62/852 |
| 2022/0223695 A1* | 7/2022 | More | H10D 84/0177 |
| 2022/0231153 A1* | 7/2022 | Lu | H01L 21/02178 |
| 2022/0293582 A1* | 9/2022 | Moriwaki | H10D 64/514 |

* cited by examiner

*Primary Examiner* — Edward Chin
(74) *Attorney, Agent, or Firm* — TraskBritt

(57) ABSTRACT

A microelectronic device is disclosed, comprising a base structure comprising: active regions individually comprising semiconductor material; and isolation regions horizontally alternating with the active regions and individually comprising insulative material; a transistor structure comprising: a channel within one of the active regions of the base structure and horizontally interposed between two of the isolation regions; a gate dielectric structure including a high-k material above the channel; a gate electrode stack on the gate dielectric structure and comprising: diffusion prevention material on the gate dielectric structure and partially horizontally overlapping the channel, an opening in the diffusion prevention material horizontally centered about a horizontal centerline of the channel and having a smaller horizontal dimension than the channel; a conductive material comprising lanthanum on the diffusion prevention material and substantially filling the opening.

19 Claims, 6 Drawing Sheets

MICROELECTRONIC DEVICES, AND RELATED MEMORY DEVICES, ELECTRONIC SYSTEMS, AND METHODS

TECHNICAL FIELD

The disclosure, in various embodiments, relates generally to the field of integrated circuit device design and fabrication. More specifically, the disclosure relates to microelectronic devices including complementary metal-oxide-semiconductor devices, and to related memory devices and electronic systems.

BACKGROUND

Integrated circuitry may include complementary metal oxide semiconductor (CMOS) devices including CMOS circuitry including a p-type metal oxide semiconductor (PMOS) transistor including a p-type channel region and an n-type metal oxide semiconductor (NMOS) transistor including an n-type channel region. A continued goal of integrated circuitry design is to develop CMOS devices having PMOS and NMOS transistors configured to achieve desired operational parameters, and to develop methods for fabricating such CMOS devices. Unfortunately, miniaturization creates fabricating and performances challenges that affect the performance of the CMOS transistor devices.

DETAILED DESCRIPTION

Figure 1:
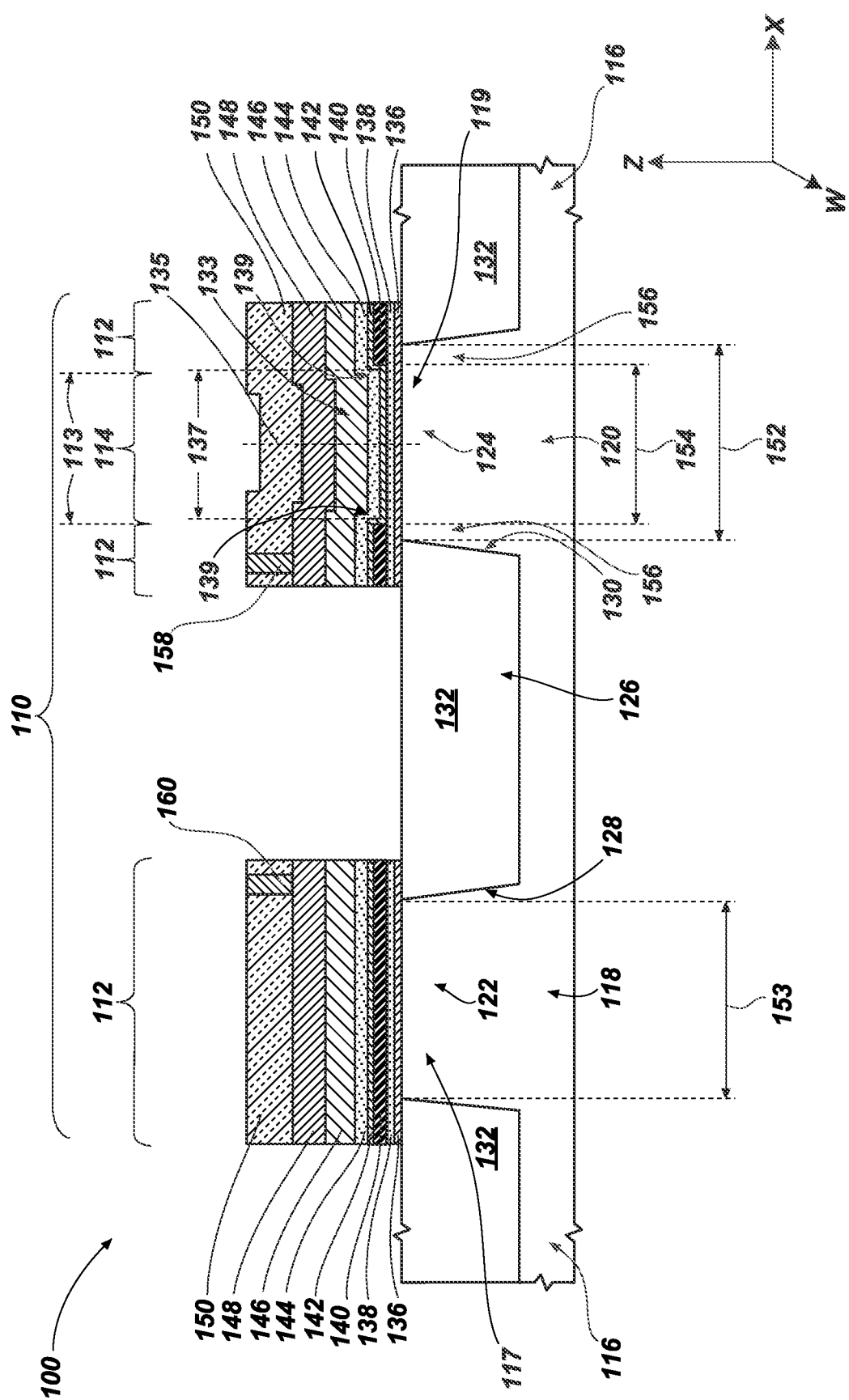
FIG. 1 is a simplified longitudinal cross-section elevation view of a microelectronic device including a CMOS device structure.

During CMOS manufacturing, a local layout effect (LLE) may result in reduced layout efficiency and reduced speed due to parasitic capacitance. The LLE may be even less useful where certain metallic material in CMOS gate stack structures, migrate into isolation regions, which may cause higher threshold voltages ($V_t$).

The following description provides specific details, such as material compositions, shapes, and sizes, in order to provide a thorough description of embodiments of the disclosure. However, a person of ordinary skill in the art would understand that the embodiments of the disclosure may be practiced without employing these specific details. Indeed, the embodiments of the disclosure may be practiced in conjunction with conventional microelectronic device fabrication techniques employed in the industry. In addition, the description provided below does not form a complete process flow for manufacturing a microelectronic device (e.g., a memory device, an integrated-circuit device, a disaggregated-die integrated circuit device). The structures described below do not form a complete microelectronic device. However, those process acts and structures are useful to understand the embodiments of the disclosure are described in detail below. Additional acts to form a complete microelectronic device from the structures may be performed by conventional fabrication techniques.

Drawings presented herein are for illustrative purposes only, and are not meant to be actual views of any particular material, component, structure, device, or system. Variations from the shapes depicted in the drawings as a result, for example, of manufacturing techniques and/or tolerances, are to be expected. Thus, embodiments described herein are not to be construed as being limited to the particular shapes or regions as illustrated, but include deviations in shapes that result, for example, from manufacturing. For example, a region illustrated or described as box-shaped may have rough and/or nonlinear features, and a region illustrated or described as round may include some rough and/or linear features. Moreover, sharp angles that are illustrated may be rounded, and vice versa. Thus, the regions illustrated in the figures are schematic in nature, and their shapes are not intended to illustrate the precise shape of a region and do not limit the scope of the present claims. The drawings are not necessarily to scale. Additionally, elements common between figures may retain the same numerical designation.

As used herein, a "memory device" means and includes microelectronic devices exhibiting memory functionality, but not necessarily limited to memory functionality. Stated another way, and by way of non-limiting example only, the term "memory device" includes not only conventional memory (e.g., conventional volatile memory, such as conventional dynamic random access memory (DRAM); conventional non-volatile memory, such as conventional NAND memory), but also includes an application specific integrated circuit (ASIC) (e.g., a system on a chip (SoC)), a microelectronic device combining logic and memory, and a graphics processing unit (GPU) incorporating memory.

As used herein, the term "integrated circuit" or "integrated-circuit device" may refer to a "microelectronic device" or a "nanoelectronic device," each of which may be tied to a critical dimension exhibited by inspection. The term "integrated circuit" includes without limitation a memory device, as well as other devices (e.g., semiconductor devices) which may or may not incorporate memory. The term "integrated circuit" may include without limitation a logic device. The term "integrated circuit" may include without limitation a processor device such as a central-processing unit (CPU) or a graphics-processing unit (GPU). The term "integrated circuit" may include without limitation or a radiofrequency (RF) device. Further, an "integrated-circuit" device may incorporate memory in addition to other functions such as, for example, a so-called "system on a chip" (SoC) including a processor and memory, or an integrated-circuit device including logic and memory. Further, an "integrated-circuit" device may incorporate memory in addition to other functions such as, for example, a so-called "disaggregated-die device" where distinct integrated-circuit components are associated to produce the higher function such as that of an SoC, including a processor alone, a memory alone, a processor and a memory, or an integrated-circuit device including logic and memory. A disaggregated-die device may be a system-in-package (SiP) assembly that includes at least two of at least one logic processor, at least one graphics processor, at least one memory device such as a 3-dimensional NAND memory device, at least one radio-frequency device, at least one analog device such as a capacitor, an inductor, a resistor, a balun, and these several at least one SiP devices, among others, may be assembled and connected with at least one embedded, multi-die interconnect bridge (EMIB) device, and at least two of the devices may be coupled with through-silicon via (TSV) technologies.

As used herein, the term "configured" refers to a size, shape, material composition, orientation, and arrangement of one or more of at least one structure and at least one apparatus facilitating operation of one or more of the structure and the apparatus in a pre-determined way.

As used herein, the terms "vertical," "longitudinal," "horizontal," and "lateral" are in reference to a major plane of a structure and are not necessarily defined by earth's gravitational field. A "horizontal" or "lateral" direction is a direction that is substantially parallel to the major plane of the structure, while a "vertical" or "longitudinal" direction is a direction that is substantially perpendicular to the major plane of the structure. The major plane of the structure is defined by a surface of the structure having a relatively large area compared to other surfaces of the structure. With reference to the figures, a "horizontal" or "lateral" direction may be perpendicular to an indicated "Z" axis, and may be parallel to an indicated "X" axis and/or parallel to an indicated "Y" axis; and a "vertical" or "longitudinal" direction may be parallel to an indicated "Z" axis, may be perpendicular to an indicated "X" axis, and may be perpendicular to an indicated "Y" axis. Further as used herein, a gate width direction may be presented as a "W" axis in a CMOS device, where the Y-axis is supplanted with the W-axis to indicate the direction of a gate width.

As used herein, features (e.g., regions, structures, devices) described as "neighboring" one another means and includes features of the disclosed identity (or identities) that are located most proximate (e.g., closest to) one another. Additional features (e.g., additional regions, additional structures, additional devices) not matching the disclosed identity (or identities) of the "neighboring" features may be disposed between the "neighboring" features. Put another way, the "neighboring" features may be positioned directly adjacent one another, such that no other feature intervenes between the "neighboring" features; or the "neighboring" features may be positioned indirectly adjacent one another, such that at least one feature having an identity other than that associated with at least one the "neighboring" features is positioned between the "neighboring" features. Accordingly, features described as "vertically neighboring" one another means and includes features of the disclosed identity (or identities) that are located most vertically proximate (e.g., vertically closest to) one another. Moreover, features described as "horizontally neighboring" one another means and includes features of the disclosed identity (or identities) that are located most horizontally proximate (e.g., horizontally closest to) one another.

As used herein, spatially relative terms, such as "beneath," "below," "lower," "bottom," "above," "upper," "top," "front," "rear," "left," "right," and the like, may be used for ease of description to describe one element's or feature's relationship to another element(s) or feature(s) as illustrated in the figures. Unless otherwise specified, the spatially relative terms are intended to encompass different orientations of the materials in addition to the orientation depicted in the figures. For example, if materials in the figures are inverted, elements described as "below" or "beneath" or "under" or "on bottom of" other elements or features would then be oriented "above" or "on top of" the other elements or features. Thus, the term "below" can encompass both an orientation of above and below, depending on the context in which the term is used, which will be evident to one of ordinary skill in the art. The materials may be otherwise oriented (e.g., rotated 90 degrees, inverted, flipped) and the spatially relative descriptors used herein interpreted accordingly.

As used herein, the singular forms "a," "an," and "the" are intended to include the plural forms as well, unless the context clearly indicates otherwise.

As used herein, "and/or" includes any and all combinations of one or more of the associated listed items.

As used herein, the phrase "coupled to" refers to structures operatively connected with each other, such as electrically connected through a direct Ohmic connection or through an indirect connection (e.g., by way of another structure).

As used herein, the term "substantially" in reference to a given parameter, property, or condition means and includes to a degree that one of ordinary skill in the art would understand that the given parameter, property, or condition is met with a degree of variance, such as within acceptable tolerances. By way of example, depending on the particular parameter, property, or condition that is substantially met, the parameter, property, or condition may be at least 90.0 percent met, at least 95.0 percent met, at least 99.0 percent met, at least 99.9 percent met, or even 100.0 percent met.

As used herein, "about" or "approximately" in reference to a numerical value for a particular parameter is inclusive of the numerical value and a degree of variance from the numerical value that one of ordinary skill in the art would understand is within acceptable tolerances for the particular parameter. For example, "about" or "approximately" in reference to a numerical value may include additional numerical values within a range of from 90.0 percent to 110.0 percent of the numerical value, such as within a range of from 95.0 percent to 105.0 percent of the numerical value, within a range of from 97.5 percent to 102.5 percent of the numerical value, within a range of from 99.0 percent to 101.0 percent of the numerical value, within a range of from 99.5 percent to 100.5 percent of the numerical value, or within a range of from 99.9 percent to 100.1 percent of the numerical value.

As used herein, "conductive material" means and includes electrically conductive material such as one or more of a metal (e.g., tungsten (W), titanium (Ti), molybdenum (Mo), niobium (Nb), vanadium (V), hafnium (Hf), tantalum (Ta), chromium (Cr), zirconium (Zr), iron (Fe), ruthenium (Ru), osmium (Os), cobalt (Co), rhodium (Rh), iridium (Jr), nickel (Ni), palladium (Pd), platinum (Pt), copper (Cu), silver (Ag), gold (Au), aluminum (Al)), an alloy (e.g., a Co-based alloy, an Fe-based alloy, an Ni-based alloy, an Fe- and Ni-based alloy, a Co- and Ni-based alloy, an Fe- and Co-based alloy, a Co- and Ni- and Fe-based alloy, an Al-based alloy, a Cu-based alloy, a magnesium (Mg)-based alloy, a Ti-based alloy, a steel, a low-carbon steel, a stainless steel), a conductive metal-containing material (e.g., a conductive metal nitride, a conductive metal silicide, a conductive metal carbide, a conductive metal oxide), and a conductively doped semiconductor material (e.g., conductively-doped polysilicon, conductively-doped germanium (Ge), conductively-doped silicon germanium (SiGe)). In addition, a "conductive structure" means and includes a structure formed of and including conductive material.

As used herein, "insulative material" means and includes electrically insulative material, such one or more of at least one dielectric oxide material (e.g., one or more of a silicon oxide ($SiO_x$), phosphosilicate glass, borosilicate glass, borophosphosilicate glass, fluorosilicate glass, an aluminum oxide ($AlO_x$), a hafnium oxide ($HfO_x$), a niobium oxide ($NbO_x$), a titanium oxide ($TiO_x$), a zirconium oxide ($ZrO_x$), a tantalum oxide ($TaO_x$), and a magnesium oxide (MgO)), at least one dielectric nitride material (e.g., a silicon nitride ($SiN_y$)), at least one dielectric oxynitride material (e.g., a silicon oxynitride ($SiO_xN_y$)), and at least one dielectric carboxynitride material (e.g., a silicon carboxynitride ($SiO_xC_zN_y$)). Formulae including one or more of "x," "y," and "z" herein (e.g., $SiO_x$, $AlO_x$, $HfO_x$, $NbO_x$, $TiO_x$, $SiN_y$, $SiO_xN_y$, $SiO_xC_zN_y$) represent a material that contains an average ratio of "x" atoms of one element, "y" atoms of another element, and "z" atoms of an additional element (if any) for every one atom of another element (e.g., Si, Al, Hf, Nb, Ti). As the formulae are representative of relative atomic ratios and not strict chemical structure, an insulative material may comprise one or more stoichiometric compounds and/or one or more non-stoichiometric compounds, and values of "x," "y," and "z" (if any) may be integers or may be non-integers. As used herein, the term "non-stoichiometric compound" means and includes a chemical compound with an elemental composition that cannot be represented by a ratio of well-defined natural numbers and is in violation of the law of definite proportions. In addition, an "insulative structure" means and includes a structure formed of and including insulative material.

As used herein, the term "homogeneous" means relative amounts of elements included in a feature (e.g., a material, a structure) do not vary throughout different portions (e.g., different horizontal portions, different vertical portions) of the feature. Conversely, as used herein, the term "heterogeneous" means relative amounts of elements included in a feature (e.g., a material, a structure) vary throughout different portions of the feature. If a feature is heterogeneous, amounts of one or more elements included in the feature may vary stepwise (e.g., change abruptly), or may vary continuously (e.g., change progressively, such as linearly, parabolically) throughout different portions of the feature. The feature may, for example, be formed of and include a stack of at least two different materials.

As used herein, "semiconductor material" and "semiconductive material" each refer to a material having an electrical conductivity between those of electrically insulating materials and electrically conductive materials. For example, a semiconductor material may have an electrical conductivity of between about $10^{-8}$ Siemens per centimeter (S/cm) and about $10^4$ S/cm ($10^6$ S/m) at room temperature. Examples of semiconductor materials include elements found in column IV of the periodic table of elements such as silicon (Si), germanium (Ge), and carbon (C). Other examples of semiconductor materials include compound semiconductor materials such as binary compound semiconductor materials (e.g., gallium arsenide (GaAs)), ternary compound semiconductor materials (e.g., $Al_xGa_{1-x}As$), and quaternary compound semiconductor materials (e.g., $Ga_xIn_{1-x}As_yP_{1-y}$), without limitation. Compound semiconductor materials may include combinations of elements from columns III and V of the periodic table of elements (III-V semiconductor materials) or from columns II and VI of the periodic table of elements (II-VI semiconductor materials), without limitation. Further examples of semiconductor materials include oxide semiconductor materials such as zinc tin oxide ($Zn_xSn_yO$, commonly referred to as "ZTO"), indium zinc oxide ($In_xZn_yO$, commonly referred to as "IZO"), zinc oxide ($Zn_xO$), indium gallium zinc oxide ($In_xGa_yZn_zO$, commonly referred to as "IGZO"), indium gallium silicon oxide ($In_xGa_ySi_zO$, commonly referred to as "IGSO"), indium tungsten oxide ($In_xW_yO$, commonly referred to as "IWO"), indium oxide ($In_xO$), tin oxide ($Sn_xO$), titanium oxide ($Ti_xO$), zinc oxide nitride ($Zn_xON_z$), magnesium zinc oxide ($Mg_xZn_yO$), zirconium indium zinc oxide ($Zr_xIn_yZn_zO$), hafnium indium zinc oxide ($Hf_xIn_yZn_zO$), tin indium zinc oxide ($Sn_xIn_yZn_zO$), aluminum tin indium zinc oxide ($Al_xSn_yIn_zZn_aO$), silicon indium zinc oxide ($Si_xIn_yZn_zO$), aluminum zinc tin oxide ($Al_xZn_ySn_zO$), gallium zinc tin oxide ($Ga_xZn_ySn_zO$), zirconium zinc tin oxide ($Zr_xZn_ySn_zO$), and other similar materials.

As used herein, the term "doped semiconductor material" and "doped semiconductive material" each refer to a semiconductor material having a higher density of impurities introduced thereto than intrinsic semiconductor materials (e.g., a higher density of impurities than electron and hole densities resulting from thermal generation at room temperature). A doped semiconductor material may be doped predominantly with donor impurities such as phosphorus (P), antimony (Sb), bismuth (Bi), and arsenic (As), without limitation. Each donor impurity in a crystal lattice of semiconductor material adds a free electron, which increases the conductivity of the semiconductor material relative to the intrinsic form of the semiconductor material. Doped semiconductor materials that have been doped predominantly with donor impurities are referred to herein as "N-type semiconductor materials." A doped semiconductor may instead be doped predominantly with trivalent or acceptor impurities such as boron (B), indium (In), aluminum (Al), and gallium (Ga), without limitation. Each trivalent or acceptor impurity in a crystal lattice of semiconductor material adds an electron hole (referred to herein as "hole"), which increases the conductivity of the semiconductor material relative to the intrinsic form of the semiconductor material. Doped semiconductor materials that have been doped predominantly with trivalent or acceptor impurities are referred to herein as "P-type semiconductor materials."

As used herein, the term "semiconductor substrate" means a base semiconductive material, or constructions including semiconductive material, upon which additional features (e.g., material, structured, devices) of a relatively larger structure are formed. A semiconductor substrate may, for example, include a bulk semiconductive material such as a semiconductive wafer (either alone or in assemblies comprising other materials), and/or semiconductive material overlying another structure. The term "substrate" refers to a base material or construction, including, but not limited to, the semiconductor substrates described above. Unless the context indicates otherwise, the materials described herein may be formed by any suitable technique including, but not limited to, spin coating, blanket coating, chemical vapor deposition (CVD), plasma enhanced CVD (PECVD), atomic layer deposition (ALD), plasma enhanced ALD (PEALD), physical vapor deposition (PVD) (e.g., sputtering), or epitaxial growth. Depending on the specific material to be formed, the technique for depositing or growing the material may be selected by a person of ordinary skill in the art. In addition, unless the context indicates otherwise, removal of materials described herein may be accomplished by any suitable technique including, but not limited to, etching (e.g., dry etching, wet etching, vapor etching), ion milling, abrasive planarization (e.g., chemical-mechanical planarization (CMP)), or other known methods.

FIG. 1 is a simplified longitudinal cross-section elevation view of a microelectronic device structure 100 including a CMOS device structure 110. The CMOS device structure 110 includes a PMOS transistor structure 112 (p-channel gate stack) and an NMOS transistor structure 114 (n-channel gate stack) which are supported by a semiconductor substrate 116. The semiconductor substrate 116 may be formed of and include an n-type functioning region 118 adjacent a p-type functioning region 120. The semiconductor substrate 116 may comprise semiconductor material and may, for example, include doped monocrystalline silicon. As described in further detail below, portions of the PMOS transistor structure 112 and the semiconductor substrate 116 may form and define a PMOS transistor 117 of the CMOS device structure 110; and portions of the NMOS transistor structure 114 and additional portions of the semiconductor substrate 116 may form and define an NMOS transistor 119 of the CMOS device structure 110.

The PMOS transistor structure 112 (and hence, the PMOS transistor 117) includes a p-channel region 122 within the n-type functioning region 118 of semiconductor substrate 116. The NMOS transistor structure 114 (and hence, the NMOS transistor 119) includes an n-channel region 124 within the p-type functioning region 120 of semiconductor substrate 116. The n-channel region 124 may have a second channel length 154 in a range from about 80 nanometer (nm) to about 120 nm. In an embodiment, the second channel length 154 is about 100 nm.

An isolation region 126 is horizontally interposed between the PMOS transistor structure 112 and the NMOS transistor structure 114. The PMOS transistor structure 112 may be positioned at a first side 128 of the isolation region 126, and the NMOS transistor structure 114 is on a second side 130 of the isolation region 126, where the second side 130 of the isolation region 126 is opposite the first side 128 of the isolation region 126. The isolation region 126 may have a shallow-trench isolation (STI) configuration. The isolation region 126 is a trench within the semiconductor substrate 116 filled with insulative material 132. In some embodiments, the insulative material 132 is a dielectric oxide material, such as silicon dioxide.

The CMOS device structure 110 may include additional materials that cover both the PMOS transistor structure 112 and the NMOS transistor structure 114, such as additional dielectric materials such as a gate dielectric material 136 that is above and on exposed surfaces of the semiconductor substrate 116 and the insulative material 132 of the isolation region 126. Further, a first gate dielectric structure 138 (also referred to as a gate dielectric structure 138 containing high-k material) is above and on the gate dielectric material 136. The term "high-k" means a higher dielectric constant than silicon dioxide. In an embodiment, the gate dielectric material 136 is a silicon oxide material such as silicon dioxide ($SiO_2$), and the gate dielectric structure 138 is an oxide material such as hafnium oxide (HfO). The gate dielectric material 136 may have a thickness (Z-direction) in a range from 1.5 nm to about 2 nm. The gate dielectric structure 138 may have a thickness (Z-direction) in a range from 1.5 nm to about 2 nm. The combination of the gate dielectric material 136 and the gate dielectric structure 138 may include any useful composition or combination of compositions that may achieve a desired threshold voltage ($V_T$) of the n-channel region 124.

With further reference to the NMOS transistor structure 114, a first diffusion prevention material 140 is located above the n-channel region 124, and the diffusion prevention material 140 extends to lateral boundaries of the NMOS transistor structure 114, such that a first channel length 152 in the n-channel region 124 is the full channel length of the NMOS transistor structure 114 at the n-channel region 124. In some embodiments, the first diffusion prevention material 140 is a gate nitride material 144. The diffusion prevention material 140 has lateral exterior boundaries that encroach across and beyond the first channel length 152. Also, the diffusion prevention material 140 has lateral interior boundaries that define a second channel length 154 that is less than the first channel length 152. During processing, (e.g., FIG. 3A), the diffusion prevention material 140 exposes (e.g., does not horizontally overlap) central portions of the gate dielectric structure 138 horizontally overlapping the n-channel region 124. In an embodiment, the diffusion prevention material 140 exposes central portions of the gate dielectric structure 138 in a manner about a symmetry line 135. The diffusion prevention material 140 may include a conductive nitride material, such as titanium aluminum nitride (TiAlN).

Dimensional relationships of lengths of the diffusion prevention material 140 with respect to partial encroachment of the diffusion prevention material 140, to create the second channel length 154 to create channel-end regions 156 are further disclosed below. The second channel length 154 may be quantified by the length (X-direction) of channel-end regions 156, where the channel-end regions 156 each have a length (Z-direction) within a range of from about zero (0) nm to about 10 nm. In an embodiment where the first channel length 152 is about 100 nm and the channel-end regions 156 each have a length (X-direction) of about 10 nm, the second channel length 154 is about 80 nm. In an embodiment, each of the channel-end regions 156 has a length (X-direction) within a range of from about 1 nm to about 10 nm. In an embodiment, the second channel length 154 is substantially the same as the first channel length 152, and the channel-end regions 156 are substantially 0 nm, within photolithographic processing limitations.

Still referring to FIG. 1, the PMOS transistor structure 112 has a PMOS channel length 153 that is the full channel length of the PMOS transistor structure 112 (p-channel gate stack) at the p-channel region 122 within the material of the semiconductor substrate 116, that is below and on the gate dielectric material 136. In an embodiment, the PMOS channel length 153 for the PMOS transistor structure 112 is larger than the first channel length 152 for the NMOS transistor structure 114.

With further reference to FIG. 1, a first gate material 142 may extend discontinuously across the CMOS device structure 110. A portion of the first gate material 142 may horizontally overlap the PMOS transistor structure 112 and another portion may be discrete from the portion and may horizontally overlap the NMOS transistor structure 114. In an embodiment, the first gate material 142 is a metallic material (e.g., an elemental metal), such as a lanthanum (La). In an embodiment, the first gate material 142 has a thickness within a range of from about 5 nm to about 10 nm, such as about 7 nm. With respect to the portion of the first gate material 142 above and horizontally overlapping the n-channel region 124 of the NMOS transistor structure 114, the portion of the first gate material 142 may be above and on the gate dielectric structure 138, and the first gate material 142 may form an independent topology source structure 133 that projects a third channel length 137 into the n-channel region 124. By "independent topology source structure 133" it is meant that a Z-direction topology structure extends across the area of the NMOS transistor structure 114, with a new Z-direction topology for the entire structure of the first gate material 142. Further, the first gate material 142 creates step features 139 that are bounded by the third channel length 137. Further, portions of the p-channel device structure 112 appear to encroach onto the lateral portions of the n-channel device structure 114, by virtue of the gate dielectric structure 138 at the independent topology source structure 133, also where the step features 139 also originate.

During fabrication, a thermal budget is observed to resist diffusion of portions of the first gate material 142 into neighboring insulative material 132 at the n-channel region 124. The diffusion prevention material 140 (e.g., TiAlN) provides useful obstruction of metal migration from the first gate material 142 (e.g., La) where the internal boundaries of the first diffusion prevention material 140, abut and create the third channel length 137, and where external boundaries of the diffusion prevention material 140 extend laterally over the neighboring insulative material 132. The diffusion prevention material 140 obstructs (e.g., impedes, prevents) metal migration (e.g., diffusion) which may otherwise degrade performance of the NMOS transistor 119. Because of thermal budget limitations during fabrication and because of device heating effects during field use of the CMOS device structure 110, without the first diffusion prevention material 140 terminating at or extending into the first channel length 152 boundaries of the NMOS transistor structure 114, metal (e.g., La) diffusion from the first gate material 142 into the neighboring insulative material 132 would be more likely. In an embodiment, as a result of the degree of encroachment of the first diffusion prevention material 140 into the n-channel region 124 to create the channel-end regions 156, a useful $V_T$ is obtained compared to when metal (e.g., La) diffusion into the neighboring insulative material 132 occurs. A gate nitride material 144 is above and on the first gate material 142. The gate nitride material 144 may be formed of and include at least one metal nitride, such as titanium nitride ($Ti_xN$). By location of the gate nitride material 144 above the independent topology source structure 133, the independent topology source structure 133 may be carried forward (X-Z dimensions) in the gate nitride material 144 and laterally within the boundaries of the third channel length 137.

A first interconnect material 146 may extend across the gate nitride material 144. The first interconnect material 146 may be referred to as a first peripheral interconnect 146. The first interconnect material 146 may be a material such as conductively doped polysilicon. In an embodiment, the first interconnect material 146 has a thickness (Z-direction) within a range of from about 30 nm to about 70 nm, such as from about 40 nm to about 60 nm, or about 50 nm. In addition, a second interconnect material 148 may extend across the first peripheral interconnect 146. The second interconnect material 148 may be referred to as a second peripheral interconnect 148. The second interconnect material 148 may be formed of and include conductive material, such as metal (e.g., W). A gate cap material 150 may extend across the second interconnect material 148. The gate cap material 150 may be formed of and include dielectric material, such as dielectric nitride material (e.g., $Si_xN$). Other structures depicted in the CMOS device structure 110 include wiring contact plugs, including an n-channel wiring plug 158 that connects the n-channel device structure 114 to other structures within an integrated-circuit device, and a p-channel wiring plug 160 that connects the p-channel device structure 112 to other structures within an integrated-circuit device. Fabrication of the CMOS device structure 110 may include the assembly of both the p-channel device structure 112 and the n-channel device structure 114 simultaneously, followed by at least one material removal act that separates the p-channel device structure 112 and the n-channel device structure 114.

Figure 2:
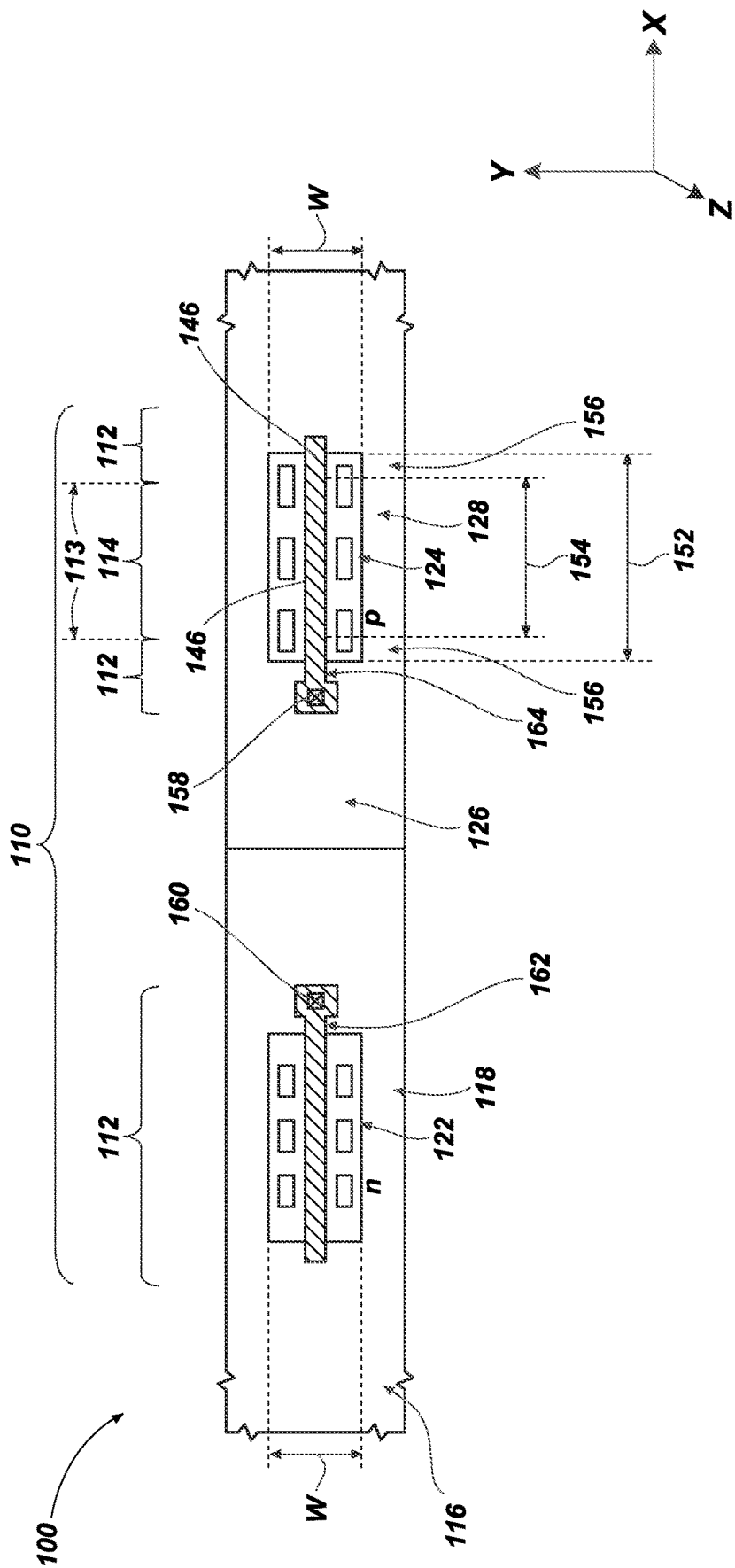
FIG. 2 is a simplified, partial top view of the microelectronic device depicted in FIG. 1.

FIG. 2 is a simplified, partial top view of the microelectronic device structure 100 depicted in FIG. 1. The p-channel region 122 and the n-channel region 124 are also characterized by a gate width, W, that is depicted generically by the designation W that is substantially orthogonal to the X-direction. Characteristic behavior of the NMOS transistor structure 114 is affected in part by the first channel length 152, the gate width, W, the second channel length 154 created by positioning and patterning of the diffusion prevention material 140 to create the n/p boundaries 113 (and the thickness of the diffusion prevention material 140 (FIG. 1)) and the channel-end regions 156. Consequently, the n-channel region 124 has useful properties that are quantified by such dimensions as the gate width, W (that is orthogonal to the X-direction), in connection with the first channel length 152 and the second channel length 154 to form the channel-end regions 156, if present, of the p-type functioning region 120 of the NMOS transistor structure 114.

Still referring to FIG. 2, by formation and patterning to position the first diffusion prevention material 140 (FIG. 1) within the boundaries of the NMOS transistor structure 114, the first interconnect material 146 is expanded to make contact with the n-channel wiring plug 158 at a location 164, and with the p-channel wiring plug 160 at a location 162, but no other expansion in the Y-direction is used. During miniaturization, restriction of expansion only at the locations 162 and 164, a tendency is lowered of the first interconnect material 146 to bridge to adjacent occurrences (Y-direction) of interconnects 146 (not illustrated).

Figure 3A:
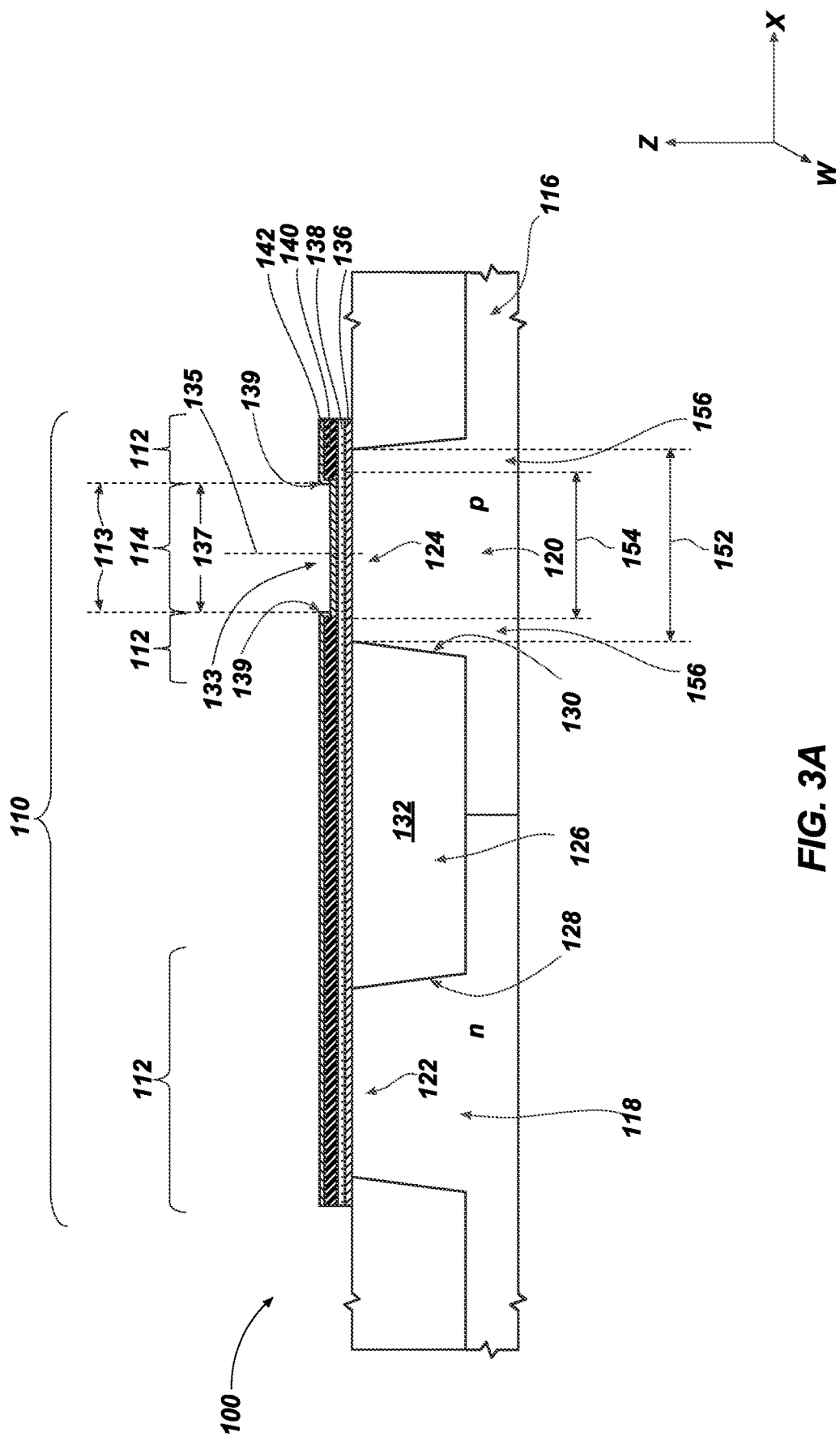
FIGS. 3A and 3B are simplified cross-section elevation views of the microelectronic device structure depicted in FIGS. 1 and 2 during fabrication.
Figure 3B:
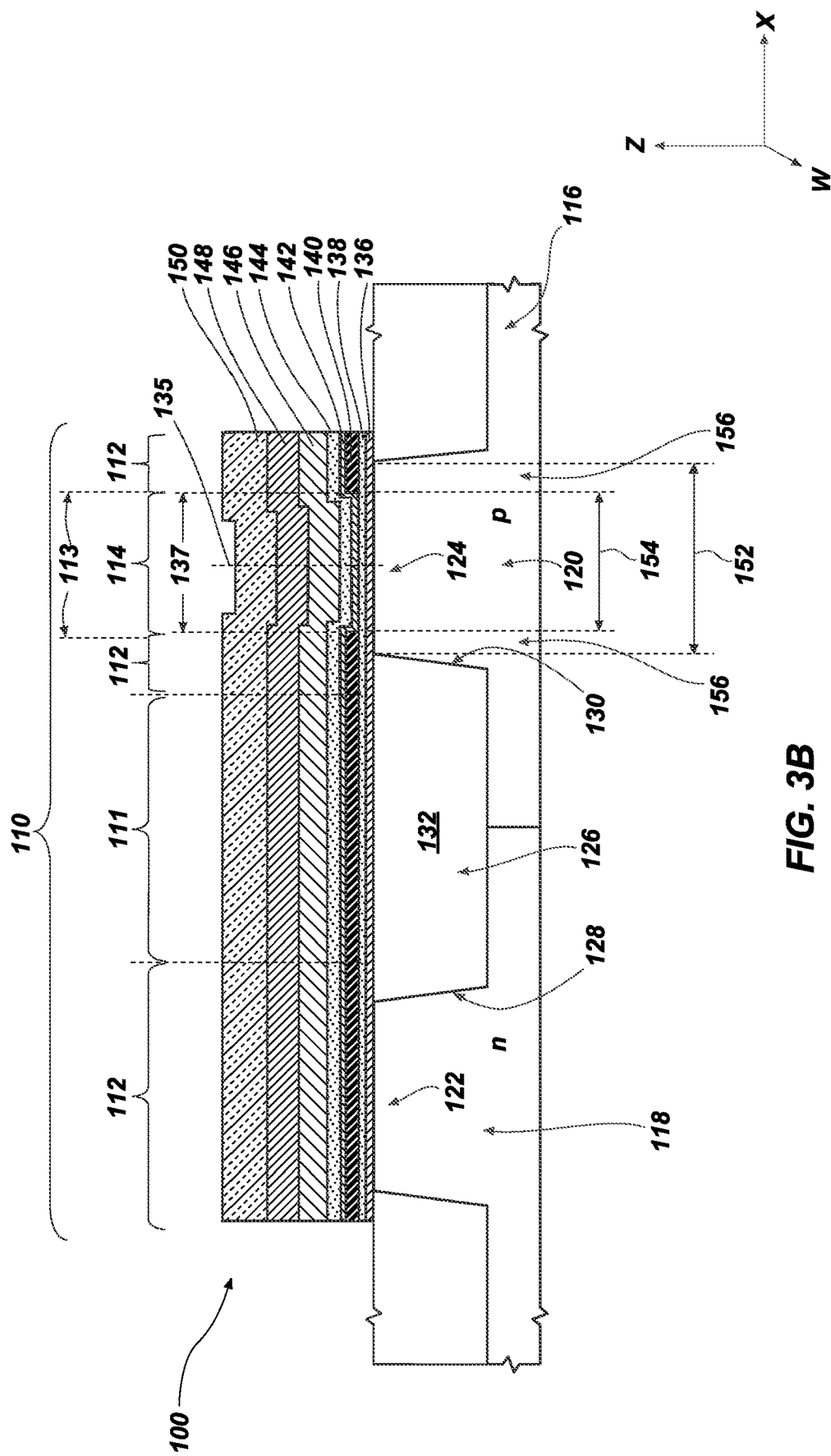

FIGS. 3A and 3B are simplified cross-section elevation views of the microelectronic device structure 100 depicted in FIGS. 1 and 2 during fabrication according to several embodiments. FIG. 3A illustrates processing including formation of the diffusion prevention material 140. The diffusion prevention material 140 is first formed over the upper surfaces of the gate dielectric structure 138. The gate dielectric structure 138 may be located vertically above (e.g., directly vertically above) the gate dielectric material 136 that is located vertically above (e.g., directly vertically above) the semiconductor substrate 116 and the insulative material 132.

The diffusion prevention material 140 may be patterned to form an opening exposing a portion of the gate dielectric structure 138 within a horizontal area of the n-channel region 124. In an embodiment, a horizontal center of the opening in diffusion prevention material 140 is horizontally aligned (e.g., in the X-direction) with the symmetry line 135. In an embodiment, the diffusion prevention material 140 is substantially bilaterally symmetrical about the symmetry line 135. The diffusion prevention material 140 may vertically overlie and partially horizontally overlap the n-channel region 124. The channel-end regions 156 in the n-channel region 124 may be formed through the patterning of the diffusion prevention material 140 as illustrated and described. Thereafter, the first gate material 142 may be formed (e.g., conformally formed) on or over the diffusion prevention material 140. The independent topology source structure 133 is characterized by the third channel length 137, the height (Z-direction) by the combination of the diffusion prevention material 140, and the first gate material 142 by step features 139 that are bounded by the third channel length 137. The step features 139 at n/p boundaries 113 create an independent topology source structure with the characteristic third channel length 137 that may be the same length as, or less than the first channel length 152 and greater than the second channel length 154.

FIG. 3B illustrates further processing of the microelectronic device structure 100 depicted in FIG. 3A, including formation of the additional structures above the independent topology source structure 133, up to and including the gate cap material 150. Thereafter, at least one material removal act or several processes, is conducted at a removal area 111 to separate the PMOS transistor structure 112 and the NMOS transistor structure 114, as illustrated in FIG. 1.

Figure 4:
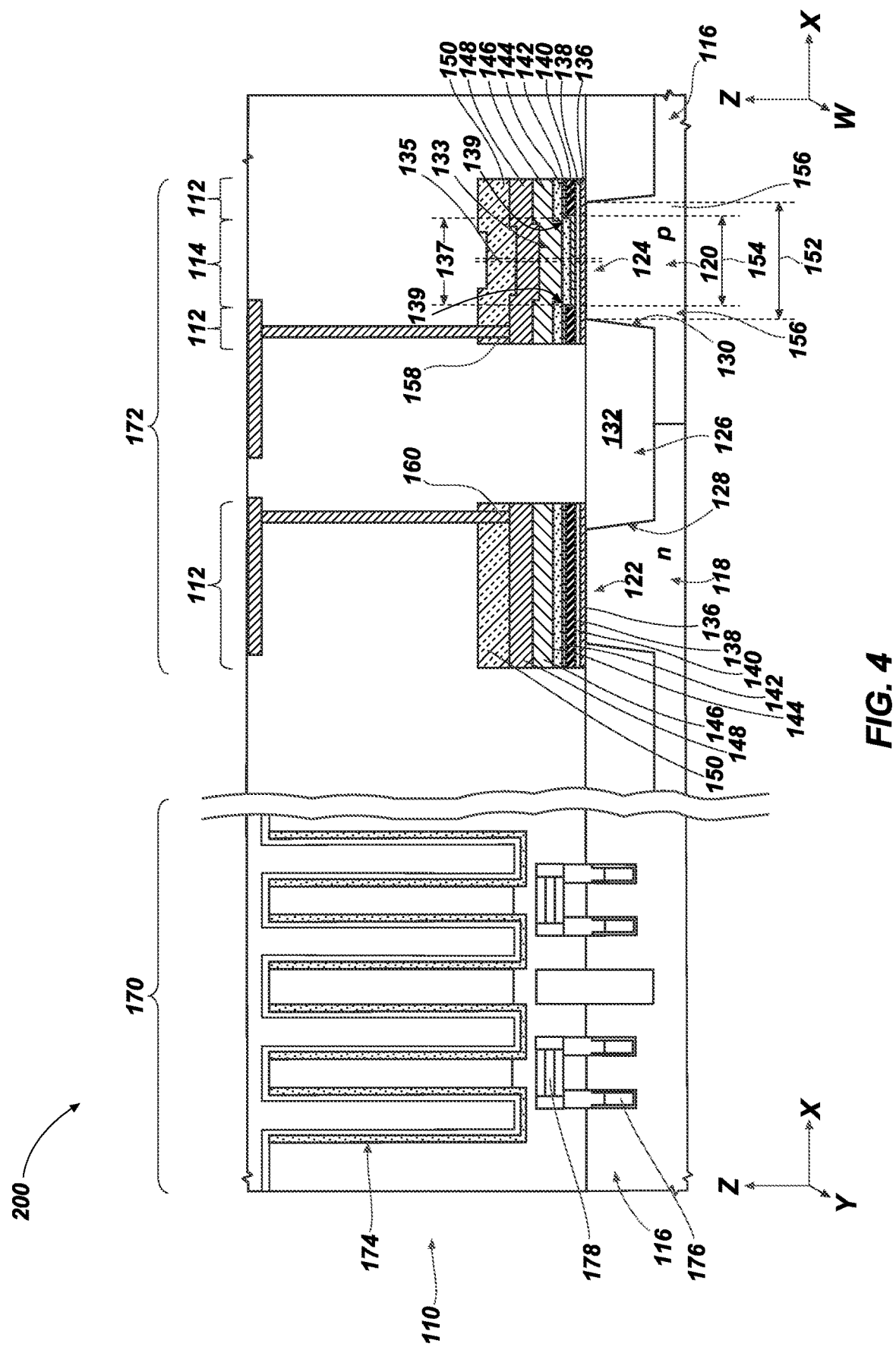
FIG. 4 illustrates a simplified partial elevational cross-section view of a portion of a microelectronic device such as a memory device according to embodiments of disclosure.

Microelectronic device structures of the disclosure (e.g., the microelectronic device structure 100 described with reference to FIGS. 1 and 2) may be included in microelectronic devices of the disclosure. For example, FIG. 4 illustrates a simplified partial elevational cross-sectional view of a portion of a microelectronic device 200 (e.g., a memory device, such as a DRAM device), in accordance with embodiments of the disclosure. The microelectronic device 200 may include a memory array region 170 and a peripheral circuit region 172 horizontally neighboring the memory array region 170. The memory array region 170 may include a memory device structure 172 including memory cells 174 (e.g., DRAM cells) arranged within an X-Y plane. The peripheral circuit region 172 may include the CMOS device structure 110. The peripheral circuit region 172, including the CMOS device structure 110 thereof, may be configured for and employed to control operations (e.g., read operations, write operations, erase operations) for the memory cells 174 within the memory array region 170.

The memory array region 170 includes the memory device structure 172 that includes storage node devices 174 (e.g., capacitors), access lines 176 (e.g., word lines), and data lines 178 (e.g., bit lines, data lines) for signal and data communication to other parts of the microelectronic device 200. In an embodiment, the CMOS device structure 110 may be used for other functions that are not associated with a memory device structure 172.

Figure 5:
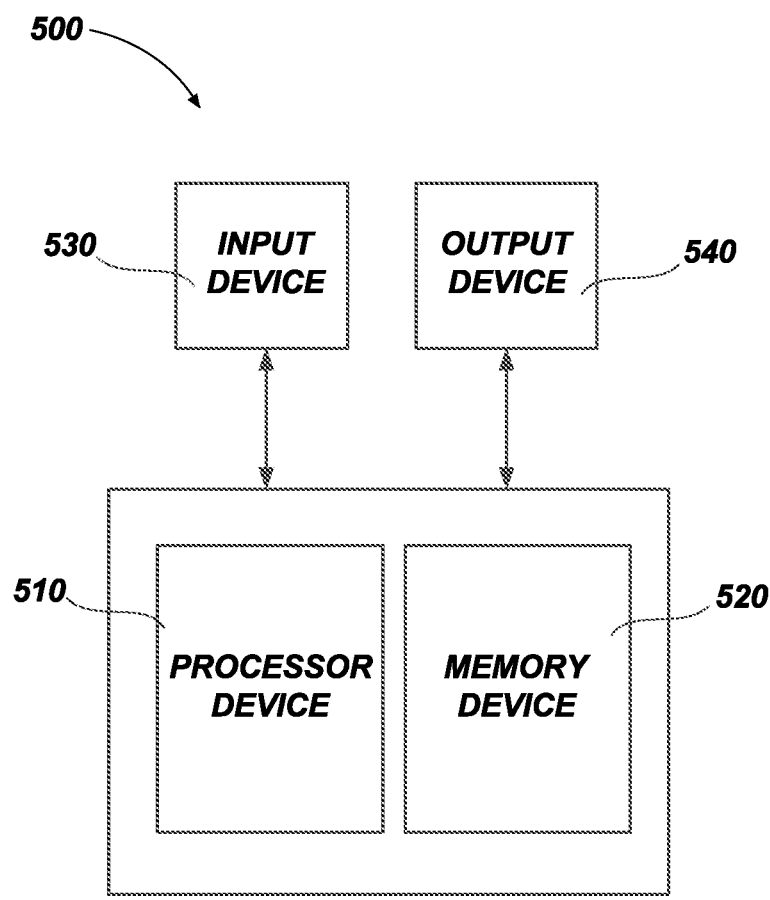
FIG. 5 is a simplified block diagram of an electronic system, according to embodiments of disclosure.

Microelectronic devices (e.g., the microelectronic device 200 (FIG. 4)) and the microelectronic device structures (e.g., the microelectronic device structure 100 (FIGS. 1 and 2)) of the disclosure may be included in embodiments of electronic systems of the disclosure. For example, FIG. 5 is a block diagram of an electronic system 500, according to embodiments of disclosure. The electronic system 500 may comprise, for example, a computer or computer hardware component, a server or other networking hardware component, a cellular telephone, a digital camera, a personal digital assistant (PDA), portable media (e.g., music) player, a Wi-Fi or cellular-enabled tablet such as, for example, an iPAD® or SURFACE® tablet, an electronic book, or a navigation device where embodiments of the microelectronic device structure 100 (FIG. 1) may be employed. The electronic system 500 includes at least one memory device 520. The memory device 520 may include, for example, one or more of a microelectronic device structure (e.g., the microelectronic device structure 100 (FIG. 1)) and a microelectronic device (e.g., the microelectronic device 200 (FIG. 4)) of the disclosure. The electronic system 500 may further include at least one electronic signal processor device 510 (often referred to as a "microprocessor") that is part of an integrated circuit. The electronic signal processor device 510 may include, for example, one or more of a microelectronic device structure (e.g., the microelectronic device structure 100 (FIG. 1)) and a microelectronic device (e.g., the microelectronic device 200 (FIG. 4)) of the disclosure. While the memory device 520 and the electronic signal processor device 510 are depicted as two (2) separate devices in FIG. 5, in additional embodiments, a single (e.g., only one) memory/processor device having the functionalities of the memory device 520 and the electronic signal processor device 510 is included in the electronic system 500. In such embodiments, the memory/processor device may include, for example, one or more of a microelectronic device structure (e.g., the microelectronic device structure 100 (FIG. 1)) and a microelectronic device (e.g., the microelectronic device 200 (FIG. 4)) of the disclosure. The processor device 510 and the memory device 520 may be part of a central processing unit where the memory device 520 includes a CMOS device structure 110 in on-die DRAM cache memory. The processor device 510 and the memory device 520 may be part of a disaggregated-die assembly 510 and 520 that may also be referred to as a disaggregated-die integrated circuit, including at least one of the processor device 510 and the memory device 520 includes more than one of such device in a more-than-two device disaggregated-die integrated circuit assembly. Further, the disaggregated-die assembly 510 and 520, may be assembled with a bridge material such as in an embedded multi-interconnect bridge that includes at least one TSV interconnect.

The electronic system 500 may further include one or more input devices 930 for inputting information into the electronic system 500 by a user, such as, for example, a mouse or other pointing device, a keyboard, a touchpad, a button, or a control panel. The electronic system 500 may further include one or more output devices 540 for outputting information (e.g., visual or audio output) to a user such as, for example, a monitor, a display, a printer, an audio output jack, and/or a speaker. In some embodiments, the input device 530 and the output device 540 may comprise a single touchscreen device that can be used both to input information to the electronic system 500 and to output visual information to a user. The input device 530 and the output device 540 may communicate electrically with one or more of the memory device 520 and the electronic signal processor device 510. In an embodiment, the processor device 510 and the memory device 520 are part of a disaggregated-die electronic system, where communication between at least one of the processor device 510 and the memory device 520 and another device includes a TSV interconnect.

Thus, disclosed is a microelectronic device, comprising a base structure comprising: active regions individually comprising semiconductor material; and isolation regions horizontally alternating with the active regions and individually comprising insulative material; a transistor structure comprising: a channel within one of the active regions of the base structure and horizontally interposed between two of the isolation regions; a gate dielectric structure including a high-k material above the channel; a gate electrode stack on the gate dielectric structure and comprising: diffusion prevention material on the gate dielectric structure and partially horizontally overlapping the channel, an opening in the diffusion prevention material horizontally centered about a horizontal centerline of the channel and having a smaller horizontal dimension than the channel; a conductive material comprising lanthanum on the diffusion prevention material and substantially filling the opening.

Thus, also disclosed is a method of forming a microelectronic device, comprising forming a gate dielectric structure including high-k material above semiconductive material of an active region of a base structure and above isolation regions of the base structure; forming diffusion prevention material on the gate dielectric structure; forming an opening vertically extending through the diffusion prevention material and exposing a portion of the gate dielectric structure, the opening horizontally centered about the active region of the base structure and horizontally offset from the isolation regions of the base structure; and conformally forming a conductive material comprising lanthanum on surfaces of the diffusion prevention material and the gate dielectric structure, the conductive material substantially filling the opening.

This, also disclosed is a memory device, comprising: a memory array region comprising dynamic random-access memory (DRAM) cells; a peripheral circuitry region neighboring the memory array region and comprising complementary metal-oxide-semiconductor circuitry comprising: a PMOS transistor; and an NMOS transistor operatively associated with the PMOS transistor and comprising: an n-type channel structure horizontally interposed between two isolation structures; gate dielectric material on and substantially covering an upper surface of the n-type channel structure; a gate dielectric structure including high-k material on and substantially coving the gate dielectric material; a first conductive gate material comprising titanium aluminum nitride on and only partially covering the gate dielectric structure, an opening extending through the first conductive gate material and to a portion of the gate dielectric structure within a horizontal area of the upper surface of the n-type channel structure; a second conductive gate material comprising lanthanum on and substantially covering the first conductive gate material and the portion of the gate dielectric structure, the second conductive gate material substantially filling the opening in the first conductive gate material and having a non-planar upper surface.

Thus, also disclosed is an electronic system, comprising: an input device; an output device; a processor device operably coupled to the input device and the output device and a memory device coupled to the processor device and comprising: memory cells; and logic circuitry operatively associated with the memory cells and comprising at least one complementary metal oxide semiconductor (CMOS) device comprising: a PMOS transistor; an NMOS transistor operatively associated with the PMOS transistor and comprising: an n-type channel having a first channel length laterally between neighboring isolation structures; a gate dielectric material above the n-type channel and the neighboring isolation structures; a gate dielectric structure including high-k material on the gate dielectric material; a gate electrode stack on the high-k gate dielectric material and comprising: a first conductive gate material on high-k gate dielectric structure and partially horizontally overlapping the n-type channel structure, an opening in the first conductive material horizontally centered about a horizontal centerline of the n-type channel structure and having a smaller horizontal length than the n-type channel structure; a conductive lanthanum-containing material on the first conductive gate material and substantially filling the opening, the conductive lanthanum-containing material having a non-planar upper boundary; and a conductive nitride material on the conductive lanthanum-containing material and having an additional non-planar upper boundary.

While the disclosure is susceptible to various modifications and alternative forms, specific embodiments have been shown by way of example in the drawings and have been described in detail herein. However, the disclosure is not limited to the particular forms disclosed. Rather, the disclosure is to cover all modifications, equivalents, and alternatives falling within the scope of the following appended claims and their legal equivalents.

What is claimed is:
1. A microelectronic device, comprising:
a base structure comprising:
active regions individually comprising semiconductor material; and
isolation regions horizontally alternating with the active regions and individually comprising insulative material;
a transistor structure comprising:
a channel within one of the active regions of the base structure and horizontally interposed between two of the isolation regions;
a gate dielectric structure including a high-k material above the channel; and
a gate electrode stack on the gate dielectric structure and comprising:
diffusion prevention material on the gate dielectric structure and partially horizontally overlapping the channel, an opening in the diffusion prevention material horizontally centered about a horizontal centerline of the channel and having a smaller horizontal dimension than the channel; and
a conductive material comprising lanthanum on the diffusion prevention material and substantially filling the opening.

2. The microelectronic device of claim 1, wherein the diffusion prevention material comprises titanium aluminum nitride.

3. The microelectronic device of claim 1, wherein:
the channel has a first length extending from and between the two of the isolation regions in a first horizontal direction; and
the opening in the diffusion prevention material has a second length in the first horizontal direction that is less than the first length, portions of the diffusion prevention material horizontally overlapping the channel defining end regions of the channel.

4. The microelectronic device of claim 3, wherein the end regions of the channel individually have a third length in the first horizontal direction within a range of from about one (1) nanometer (nm) to about 20 nm.

5. The microelectronic device of claim 3, wherein the end regions of the channel have substantially the same dimensions as one another.

6. The microelectronic device of claim 1, wherein portions of the diffusion prevention material horizontally overlap the two of the isolation regions.

7. The microelectronic device of claim 1, wherein the channel of the transistor structure comprises an n-type channel.

8. The microelectronic device of claim 1, wherein:
the gate electrode stack further comprises conductive nitride material on the conductive material; and
the transistor structure further comprises:
conductive interconnect material on the conductive nitride material;
additional conductive interconnect material on the conductive interconnect material; and
dielectric cap material on the additional conductive interconnect material.

9. The microelectronic device of claim 1, further comprising an additional transistor structure horizontally offset from the transistor structure and comprising:
an additional channel within additional one of the active regions of the base structure and horizontally interposed between an additional two of the isolation regions, the additional channel having a different conductivity type than the channel of the transistor structure;
an additional portion of the gate dielectric structure above the additional channel; and an additional gate electrode stack on the additional portion of the gate dielectric structure and comprising:
an additional portion of the diffusion prevention material on the additional portion of the gate dielectric structure, the additional portion of the diffusion prevention material horizontally overlapping an entirety of the additional channel; and
an additional portion of the conductive material on the additional portions of the diffusion prevention material.

10. The microelectronic device of claim 1, wherein the conductive material conforms to a topography defined by surfaces of the diffusion prevention material and the gate dielectric structure in physical contact therewith.

11. The microelectronic device of claim 1, further comprising a gate dielectric material above and on the channel, wherein:
the gate dielectric material comprises silicon oxide;
the gate dielectric structure comprises hafnium oxide;
the diffusion prevention material comprises titanium aluminum nitride; and
the conductive material comprises elemental lanthanum.

12. A memory device, comprising:
a memory array region comprising dynamic random-access memory (DRAM) cells;
a peripheral circuitry region neighboring the memory array region and comprising complementary metal-oxide-semiconductor circuitry comprising:
a PMOS transistor; and
an NMOS transistor operatively associated with the PMOS transistor and comprising:
an n-type channel structure horizontally interposed between two isolation structures;
gate dielectric material on and substantially covering an upper surface of the n-type channel structure;
a gate dielectric structure including high-k material on and substantially coving the gate dielectric material;
a first conductive gate material comprising titanium aluminum nitride on and only partially covering the gate dielectric structure, an opening extending through the first conductive gate material and to a portion of the gate dielectric structure within a horizontal area of the upper surface of the n-type channel structure; and
a second conductive gate material comprising lanthanum on and substantially covering the first conductive gate material and the portion of the gate dielectric structure, the second conductive gate material substantially filling the opening in the first conductive gate material and having a non-planar upper surface.

13. The memory device of claim 12, wherein the first conductive gate material partially horizontally overlaps the n-type channel structure and the each of the two isolation structures.

14. The memory device of claim 12, wherein the PMOS transistor comprises:
a p-type channel structure horizontally interposed between two additional isolation structures;
gate dielectric material on and substantially covering an upper surface of the p-type channel structure;
additional gate dielectric structure on and substantially coving the gate dielectric material;
a first additional conductive gate material comprising titanium aluminum nitride on and substantially coving the additional gate dielectric structure; and
a second additional conductive gate material comprising lanthanum on and substantially covering the first additional conductive gate material.

15. The memory device of claim 14, wherein:
a material composition of the first additional conductive gate material is substantially the same as a material composition of the first conductive gate material; and
a material composition of the second additional conductive gate material is substantially the same as a material composition of the second conductive gate material.

16. The memory device of claim 12, wherein:
a horizontal center of the opening in the first conductive gate material is substantially aligned with a horizontal center of the upper surface of the n-type channel structure; and
horizontal dimensions of the opening are smaller than horizontal dimensions of the upper surface of the n-type channel structure.

17. An electronic system, comprising:
an input device;
an output device;
a processor device operably coupled to the input device and the output device; and
a memory device coupled to the processor device and comprising:
memory cells; and
logic circuitry operatively associated with the memory cells and comprising at least one complementary metal oxide semiconductor (CMOS) device comprising:
a PMOS transistor; and
an NMOS transistor operatively associated with the PMOS transistor and comprising:
an n-type channel having a first channel length laterally between neighboring isolation structures;
a gate dielectric material above the n-type channel and the neighboring isolation structures;
a gate dielectric structure including high-k material on the gate dielectric material; and
a gate electrode stack on the gate dielectric structure and comprising:
a diffusion prevention material on the gate dielectric structure and partially horizontally overlapping the n-type channel, an opening in a first conductive material horizontally centered about a horizontal centerline of the n-type channel and having a smaller horizontal length than the n-type channel; and
a conductive lanthanum-containing material on the diffusion prevention material and substantially filling the opening, the conductive lanthanum-containing material having a non-planar upper boundary; and a conductive nitride material on the conductive lanthanum-containing material and having an additional non-planar upper boundary.

18. The electronic system of claim 17, wherein the memory cells comprising dynamic random access memory (DRAM) cells.

19. The electronic system of claim 17, wherein:
the diffusion prevention material of the gate electrode stack comprises titanium aluminum nitride; and
the conductive nitride material of the gate electrode stack comprises titanium nitride.

* * * * *